United States Patent [19]
Miyasaka et al.

[11] Patent Number: 5,274,427
[45] Date of Patent: Dec. 28, 1993

[54] SCANNING EXPOSURE APPARATUS HAVING CUTTING STRUCTURE FOR SEVERING PHOTOSENSITIVE WEB

[75] Inventors: Eiji Miyasaka; Masayuki Handa; Morihiro Takeda, all of Hikone, Japan

[73] Assignee: Dainippon Screen Mfg. Co., Ltd., Japan

[21] Appl. No.: 858,691

[22] Filed: Mar. 27, 1992

[30] Foreign Application Priority Data

Mar. 28, 1991 [JP] Japan .................................. 3-91358

[51] Int. Cl.⁵ .............................................. G03G 21/00
[52] U.S. Cl. ...................................... 355/310; 355/28
[58] Field of Search ................. 355/85, 73, 84, 27–29, 355/83, 50, 233, 315, 310; 271/272; 83/422, 447, 450, 452; 226/196, 198, 181; 242/56.6; 112/129, 130, 136, 153, 150

[56] References Cited

U.S. PATENT DOCUMENTS

| | | | |
|---|---|---|---|
| 2,595,325 | 5/1952 | Baumgartner | 226/198 |
| 3,599,584 | 8/1971 | Fowler | 112/130 |
| 3,848,554 | 11/1974 | Kropf | 112/129 X |
| 4,467,739 | 8/1984 | Hager et al. | 112/153 |
| 4,488,803 | 12/1984 | Nishihama et al. | 355/73 X |
| 4,607,836 | 8/1986 | Miyasaka | 271/272 |
| 4,754,674 | 7/1988 | Perlman | 83/422 |
| 4,914,473 | 4/1990 | Matsukawa et al. | 355/50 |
| 5,052,317 | 10/1991 | Schips | 112/129 X |

FOREIGN PATENT DOCUMENTS

| | | |
|---|---|---|
| 0117294 | 9/1984 | European Pat. Off. . |
| 0326080 | 8/1989 | European Pat. Off. . |
| 1-123239 | 5/1989 | Japan . |
| 1-123240 | 5/1989 | Japan . |
| 3-238438 | 10/1991 | Japan .................................. 355/85 |

OTHER PUBLICATIONS

Patent Abstracts of Japan; vol. 13, No. 66(P-828) Feb. 15, 1989 & JP-A-63 254 436 (Fuji Film Co., Ltd.) Oct. 21, 1988.

Primary Examiner—A. T. Grimley
Assistant Examiner—Shuk Y. Lee
Attorney, Agent, or Firm—Ostrolenk, Faber, Gerb & Soffen

[57] ABSTRACT

The slit exposure process camera keeps a photosensitive material flat in the exposure position, and further makes a useless area on the material smaller. The apparatus includes: a pair of feeding rollers 25 disposed upstream from the exposure position for conveying a photosensitive material PM; a transport guide 61 with a flat surface arranged downstream from the rollers 25; and a pressing plate 70 with sufficient elasticity and abrasion resistance for pressing the photosensitive material PM downward. The photosensitive material PM thus pressed runs in contact with a surface of the transport guide 61 and is thereby kept sufficiently flat. Since the process camera does not include another pair of rollers downstream from the exposure position, image reproduction is not disturbed by nipping of the photosensitive material with the downstream rollers, and an unusable area on the end of the photosensitive material is made relatively small.

16 Claims, 7 Drawing Sheets

Fig. 1

(PRIOR ART)

SCANNING EXPOSURE APPARATUS HAVING CUTTING STRUCTURE FOR SEVERING PHOTOSENSITIVE WEB

BACKGROUND OF THE INVENTION

1. Field of the Invention

The present invention relates to a slit exposure process camera for exposing a photosensitive material to make a printing plate, and more particularly to a mechanism of a slit exposure process camera for cutting a photosensitive material in a required length.

2. Description of the Prior Art

A slit scanning process camera is one of devices for reproducing an image of an original onto a photosensitive material to make a printing plate. The slit exposure process camera includes an exposing optical system for focusing a narrow optical image through a slit over the width of an original onto a photosensitive material. The whole image of the original is successively recorded onto the photosensitive material while the original is moved relative to the optical system and while the photosensitive material is conveyed in synchronism with the movement of the original.

Figure 1:
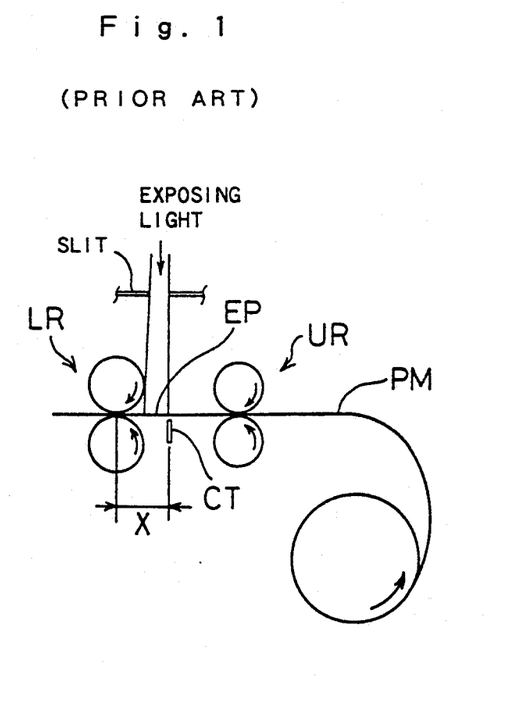
FIG. 1 schematically illustrates the structure of a prior art process camera in the vicinity of exposure position.

The slit exposure process camera requires thorough flatness of the photosensitive material in the position of exposure and constant-speed conveyance of the photosensitive material to improve the quality of exposure. Some conventional types of the camera convey the photosensitive material while keeping it in sufficient flatness in the position of exposure. FIG. 1 illustrates a structure at the exposing position of one of those cameras. This camera includes an upstream roller pair UR and a downstream roller pair LR, which are respectively disposed upstream and downstream from the exposure position EP, respectively, to convey a photosensitive material PM. The rotating speed of the downstream roller pair LR is set to be slightly greater than that of the upstream roller pair UR, whereby the photosensitive material is pulled by the roller pairs with appropriate tension and is conveyed in straight and flat manner. A driving mechanism of the upstream roller pair is provided with a one-way clutch for preventing excessive tension to the photosensitive material PM due to difference in the rotating speeds. In a typical mechanism, the upstream and downstream roller pairs UR and LR are substantially the same, and a higher rotating speed of the downstream roller pair LR is attained by a greater outside diameter of the downstream rollers.

The photosensitive material PM is held in a stationary position after completion of exposure and cut at the rear end of the exposed area with a cutter CT. The exposed area of the photosensitive material cut in the above manner is sent to the subsequent process including development and fixation. Meanwhile, the photosensitive material PM before exposure is held in the cutting position with the upstream roller pair UR. With start of another exposure process, the unexposed photosensitive material is conveyed towards the downstream roller pair LR by rotation of the upstream roller pair UR. The free end of the photosensitive material PM passes through the exposure position EP, and it is then held with the rotating downstream roller pair LR. The photosensitive material PM is thus kept in sufficient flatness by appropriate tension between the pairs of rollers again.

In this type of device, however, a certain length of the photosensitive material PM from the free end is exposed while being held only by the upstream roller pair UR; thus the portion is exposed without tension between the two pairs of rollers. The part of the photosensitive material is cut off afterwards to be discarded because the image recorded on that area is not stable nor exact. The unstable and non-exact image reproduction is attributed to two factors: the first one is the irregular movement of the photosensitive material PM when its free end is inserted into the downstream roller pair LR, and the second one is curvature or distortion of the photosensitive material PM due to the unsupported free end.

The irregular movement of the photosensitive material PM is caused by the fact that the free end of the photosensitive material PM reaches the downstream roller pair LR to be stopped a moment there, and then moves again to be drawn forward. This movement distorts the flatness and the constant-speed conveyance of the photosensitive material PM.

The second cause of the unstable image reproduction, that is, the curvature near the free end of the photosensitive material PM, is inherent in the photosensitive material due to the fact that the photosensitive material PM before exposure is wound on a roll.

SUMMARY OF THE INVENTION

An object of the present invention is accordingly to reduce the useless area of the photosensitive material near its free end which is cut off to be discarded.

The present invention is directed to a slit exposure apparatus for exposing photosensitive material with exposure light beam passing through a slit while carrying the photosensitive material relative to the slit, comprising:

a pair of feeding rollers disposed upstream from an exposure position for conveying the photosensitive material;

a guide member with a flat surface for guiding the photosensitive material, the flat surface ranging over the width of the photosensitive material and over a predetermined length upstream from the exposure position;

an resilient body, disposed upstream from the exposure position to be opposed to the flat surface of the guide member, for pressing the photosensitive material against the flat surface of the guide member; and a cutter for cutting the photosensitive material over the width thereof in the vicinity of the exposure position.

In the preferred embodiment, the resilient body comprises an abrasion-proof portion to be in contact with the photosensitive material.

Preferably, the abrasion-proof portion comprises a polymeric member to be in contact with the photosensitive material. The polymeric member comprises a polyester film.

According to an aspect of the present invention, the guide member comprises an L-shaped plate having the flat surface and a front end surface along which a cutting blade of the cutter travels. Preferably, the front end surface is positioned at a downstream edge of the exposure light beam.

According to another aspect of the present invention, the apparatus further comprises a non-nipping roller, disposed downstream from the exposure position, for preventing rise of the photosensitive material.

According to still another aspect of the present invention, the resilient body comprises an opaque member functioning as an edge of the slit. Preferably the apparatus further comprises a slit plate, disposed opposite to the opaque member across the exposure light beam, for functioning as another edge of the slit.

According to another aspect of the present invention, the apparatus further comprises: first transport means for conveying an original relative to a light source to thereby scan the original with a light beam; and second transport means for conveying the photosensitive material in synchronism with scanning of the original.

According to still another aspect of the present invention, the apparatus further comprises a developing unit for developing the photosensitive material after exposure; and a fixing unit for fixing the photosensitive material after the developing, to thereby make the photosensitive material a printing plate. Preferably, the apparatus further comprises cutting control means for cutting the photosensitive material with the cutter after conveying the photosensitive material by an additional distance on completion of exposure of the photosensitive material, the additional distance being equal to a width of the exposure light beam.

In the scanning exposure apparatus of the invention thus constructed, the photosensitive material is conveyed by the feeding rollers, and moving on the flat surface of the guide member while being pressed against the flat surface by the resilient body. Accordingly, the photosensitive material is kept flat in the exposure position. The exposed photosensitive material is then cut in the vicinity of the exposure position with the cutting member.

These and other objects, features, aspects and advantages of the present invention will become more apparent from the following detailed description of the present invention when taken in conjunction with the accompanying drawings.

DESCRIPTION OF THE PREFERRED EMBODIMENT

Figure 2:
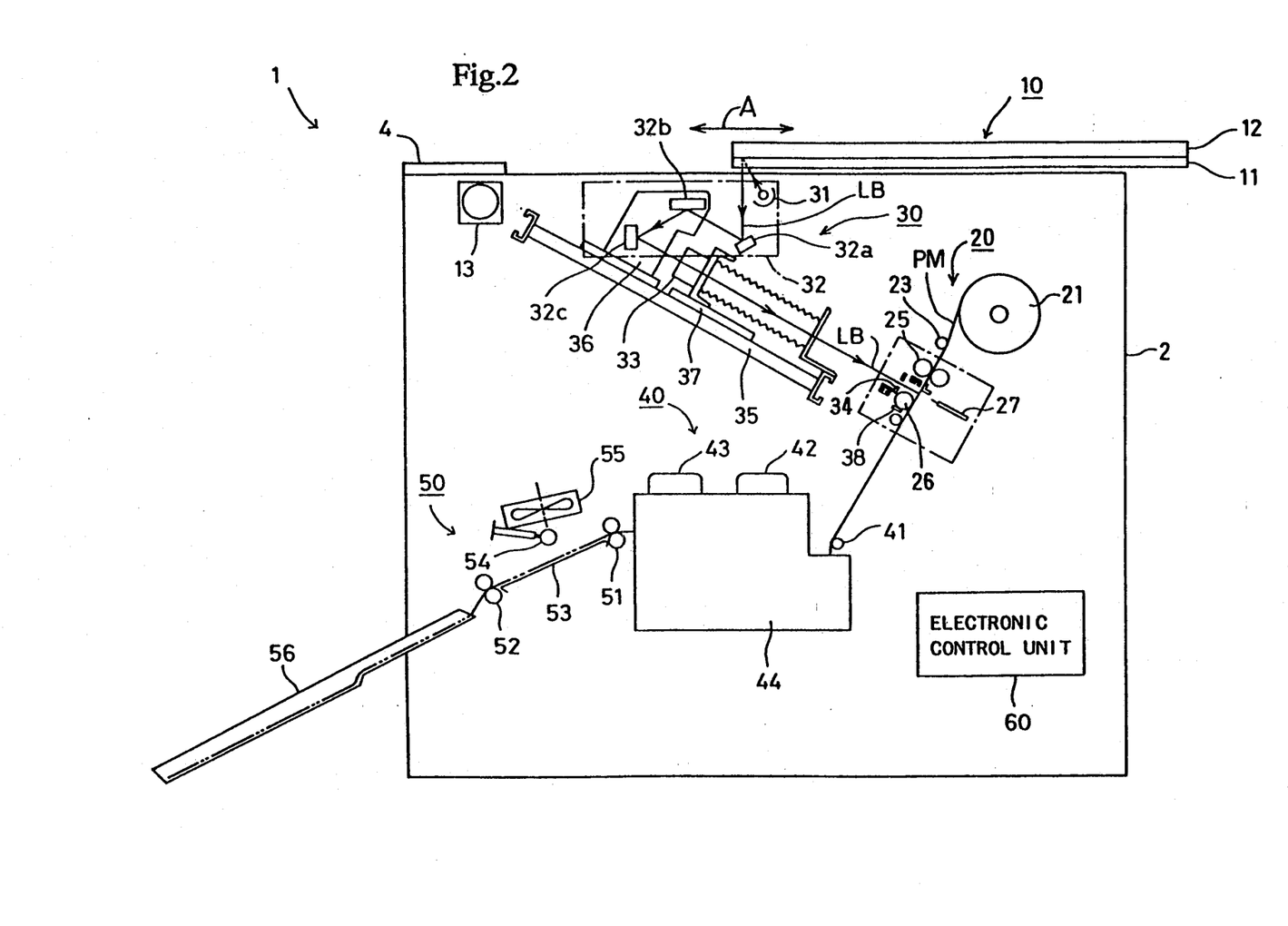
FIG. 2 schematically illustrates the basic structure of a slit exposure process camera embodying the present invention.
Figure 3:
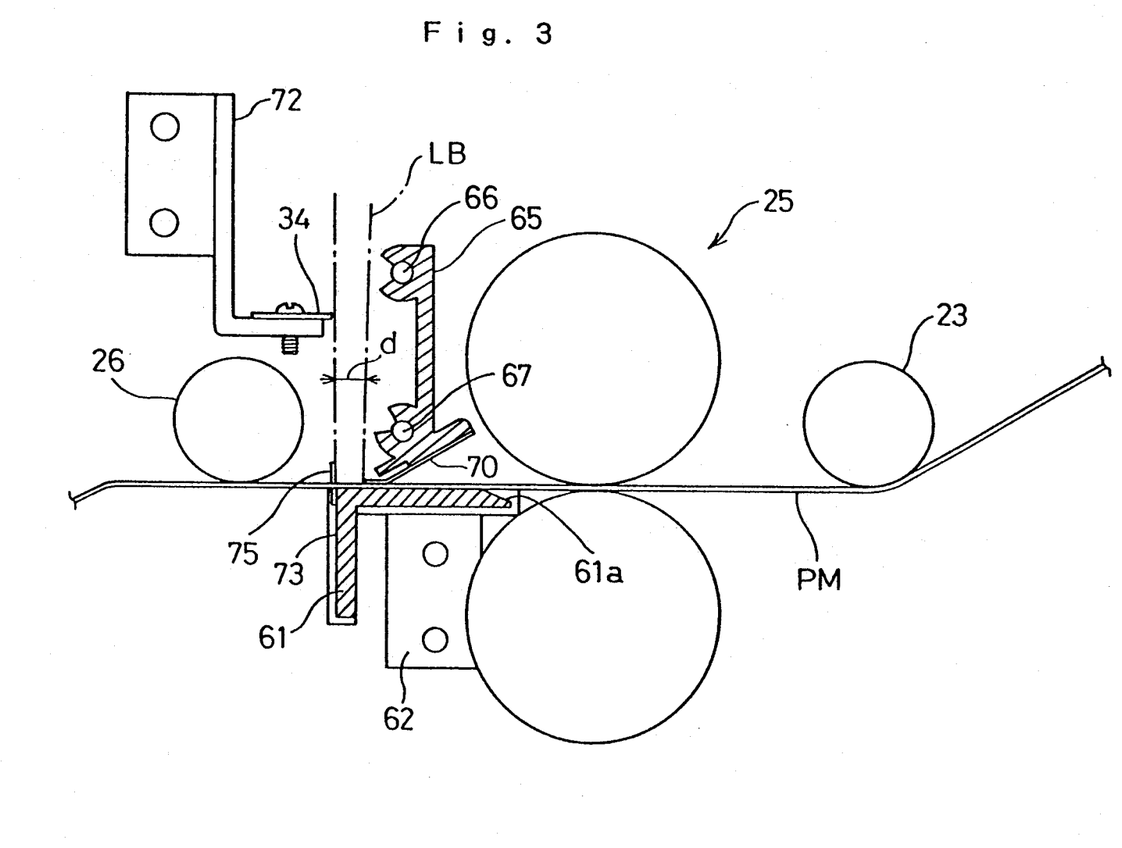
FIG. 3 schematically illustrates the structure of the process camera in the vicinity of exposure position in the process camera according to the present invention.
Figure 4:
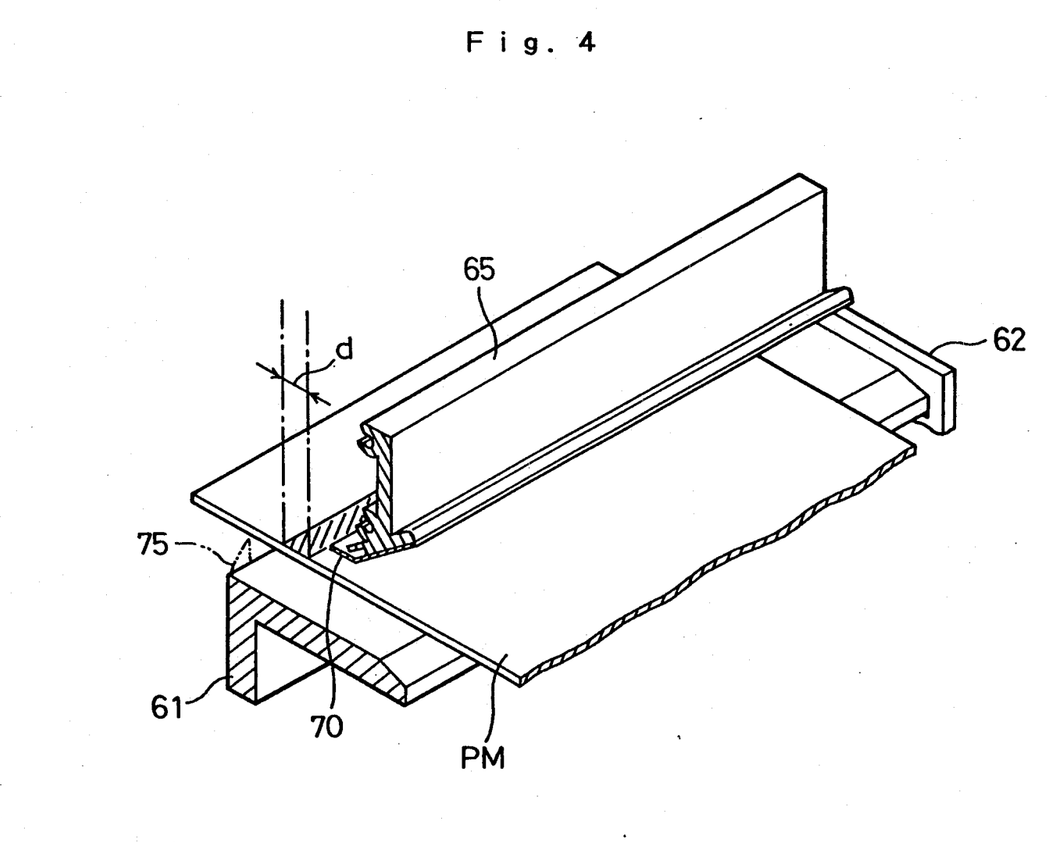
FIG. 4 is a perspective view illustrating a transport guide and a cover member.

FIG. 2 shows structure of a slit exposure process camera 1 embodying the present invention, and FIGS. 3 and 4 illustrate the detailed structure in the vicinity of the exposure position. The slit exposure process camera 1 reproduces an original image on a photosensitive material to produce a plate for small offset printing.

The slit exposure process camera 1 includes an optical projection system, and a development and fixation device disposed in a camera casing 2. The camera 1 includes: a console panel 4 mounted on the upper face of the camera casing 2; an original holder 10 arranged horizontally movable (in the direction of the arrow A of FIG. 2) along the upper face of the camera casing 2; a photosensitive material transport unit 20 for conveying a sheet of photosensitive material PM to the position of exposure; an optical projection system 30 for irradiating an original held in the holder 10 with light and focusing the light reflected from the original onto the upper face of the photosensitive material PM; a processor 40 for developing and fixing the exposed photosensitive material PM; a dry unit 50 for drying the photosensitive material PM sent from the processor 40; and an electronic control unit 60 for actuating and controlling motors and electromagnets in the camera 1.

The console panel 4 is provided with various switches including setting switches for determining exposure conditions, a power switch, and a starting switch, which are operated by an operator. Each switch on the console panel 4 is connected to the electronic control unit 60.

The holder 10 includes a transparent glass base 11 and a freely openable cover 12. An original is placed with the surface downward in between the base 11 and the cover 12. The holder 10 is driven by a driving mechanism (not shown) to move horizontally relative to a light source 31. The driving mechanism includes a motor 13 disposed in the camera casing 2, sprockets, chains, and belts.

The photosensitive material transport unit 20 includes: a roll of photosensitive material 21 supported in a freely drawable manner; a guide roller 23 for guiding the photosensitive material PM; a pair of feeding rollers 25 for carrying and conveying the photosensitive material PM; and a pressing roller 26 for pressing the photosensitive material PM downward to prevent undesirable rise of the photosensitive material PM while passing through the exposure position. A sheet of the photosensitive material PM is drawn out of the roll 21 by the photosensitive material transport unit 20 and conveyed through the exposure position to the following process at a speed synchronized with the horizontal movement of the holder 10. The detailed structure of keeping the photosensitive material PM flat in the vicinity of the exposure position is described later.

In the embodiment, a silver salt photosensitive sheet sold under the trademark of "SILVER MASTER SLM-R2" by Mitsubishi Paper Mills, Ltd., is used for the photosensitive material PM; however, it may be any other silver salt photosensitive paper for reproduction such as one sold under the trademark of "SUPER MASTER SPP" by Agfa Gevaert, or may be silver salt films and high-sensitive PS plates.

The optical projection system 30 for exposing the photosensitive material PM includes: the light source 31 for irradiating the original held in the holder 10 across its width; a mirror combination 32 consisting of three mirrors 32a, 32b, and 32c for reflecting light LB reflected from the original; a projecting lens 33 for focusing an image representing the original on the upper face of the photosensitive material PM at the exposure position; and a slit 34 for adjusting the width of the reflected light LB to be projected on the upper face of the photosensitive material PM. The projecting lens 33 are fixed to a lens support 37, and the mirrors 32b and 32c are fixed to a mirror support 36. The magnification of the optical projection system 30 is set to one in this embodiment. The mirror support 36 and the lens support 37 are adjusted in place on a slope base 35 to adjust the magnification of the system 30 and are then fixed to the slope base 35.

Light transmitting from the light source 31 is reflected at the lower face of the original. The reflected light LB is successively reflected by the three mirrors of the mirror combination 32, passes through the projecting lens 33 and the slit 34, and is focused on the photosensitive surface of the photosensitive material PM. Namely, a narrow band of an original image having the width of the original is focused on the photosensitive material PM. Since the transport of the photosensitive material PM is synchronized with the horizontal movement of the holder 10, exposure of the whole original is accomplished with completion of the horizontal movement of the holder 10.

Incidentally, plural LEDs 38 are aligned on the lower side of the pressing roller 26 for exposing the periphery of the photosensitive material PM which is not exposed to the light LB reflected from the original, whereby the peripheral part is burned out, that is, fully exposed.

After completion of exposure, the photosensitive material PM is cut in a length inputted with the console panel 4 with a cutting device 27, which is disposed on the side of the rear face of the photosensitive material PM in the exposure position.

The photosensitive material PM cut in the above manner is transported to the processor 40 for development and fixing. The processor 40 disposed below the optical projection system 30 develops and fixes the photosensitive material PM fed in via a guide roller 41. The processor 40 includes a process unit 44 with various rollers integrally driven by a motor (not shown) and disposed in the casing 2. A main developer tank 42 for storing developer and a main fixer tank 43 for storing fixer are detachably and replaceably attached to the process unit 44. The dry unit 50 is disposed downstream from the processor 40 along the transport path of the photosensitive material PM.

The dry unit 50 includes: two pairs of rollers 51 and 52 for conveying the photosensitive material PM processed by the processor 40; a transport tray 53 arranged between the roller pairs 51 and 52; a heater 54 and a fan 55 disposed over the transport tray 53 for drying the photosensitive material PM; and an external tray 56 mounted outside the casing 2. The exposed photosensitive material PM is developed and fixed by the processor 40, dried with the dry unit 50, and then fed out to the external tray 56. A plate for offset printing is completed consequently.

The structure of keeping the photosensitive material PM flat in the vicinity of the exposure position is described in detail according to FIGS. 3 and 4. An L-shaped aluminum transport guide 61 is disposed downstream from the pair of feeding rollers 25 across the photosensitive material PM. The surface of the transport guide 61 facing the photosensitive material PM is finished to have the surface roughness of not greater than 0.1 in center line average height so as to ensure smooth conveyance of the photosensitive material PM. An end 61a of the transport guide 61 at its inlet side is slanted to guide the front end of the photosensitive material PM. The transport guide 61 is fitted in grooves formed on respective side plates of the camera casing 2 and fixed in place with a metal fixture 62.

An aluminum support 65 is disposed over the upper face of the transport guide 61 across the photosensitive material PM. The aluminum support 65 is positioned and fixed to the casing 2 by fitting positioning pins 66 and 67, which are fixed on the side plates of the casing 2 and fitted in two fixing grooves of the supports 65. The bottom of the support 65 is formed to be inclined at approximately forty degrees with respect to the conveyance path of the photosensitive material PM. A pressing plate 70 made of stainless steel (SUS 304CSP) 0.05 millimeter in thickness is attached to the bottom of the support 65. A surface of the pressing plate 70 facing the photosensitive material PM is further covered with a polyester tape sold under the trademark of "#8422" by 3M Ltd. The polyester tape prevents damage to the photosensitive material PM due t the pressing force.

The bottom of the cover member 65 is slightly cut out stepwise at its lower end, and this makes the end of the pressing plate 70 free from the support 65 and resiliently deformable. The lower end of the pressing plate 70 presses the photosensitive material PM via the polyester tape against the feeding face of the transport guide 61 with its elasticity. The end of the pressing plate 70 is not a complete free end but will be supported by the bottom of the support 65 when being bent upward considerably. This structure efficiently reduces degree of deformation of the pressing plate 70 and prevents damage or breakdown of the pressing plate 70 when the photosensitive material PM is abnormally pressed and moved upward due to jam of the feeding system of the photosensitive material PM.

The flat end of the pressing plate 70 is positioned immediately before the exposure position and functions as an edge of a slit for defining the reflected light LB. The other edge of the slit is implemented by a slit plate 34 fixed to a bracket 72 such that the edge of the light LB cut by the slit plate 34 is incident on the position at the end face 73 of the transport guide 61. A cutting blade 75 driven by the cutting device 27 is mounted on the end face 73 of the transport guide 61. The cutting blade 75 is held out of the path of the photosensitive material PM during its conveyance, and moves along the end face 73 of the transport guide 61 to cut the photosensitive material PM on completion of exposure.

Figure 5:
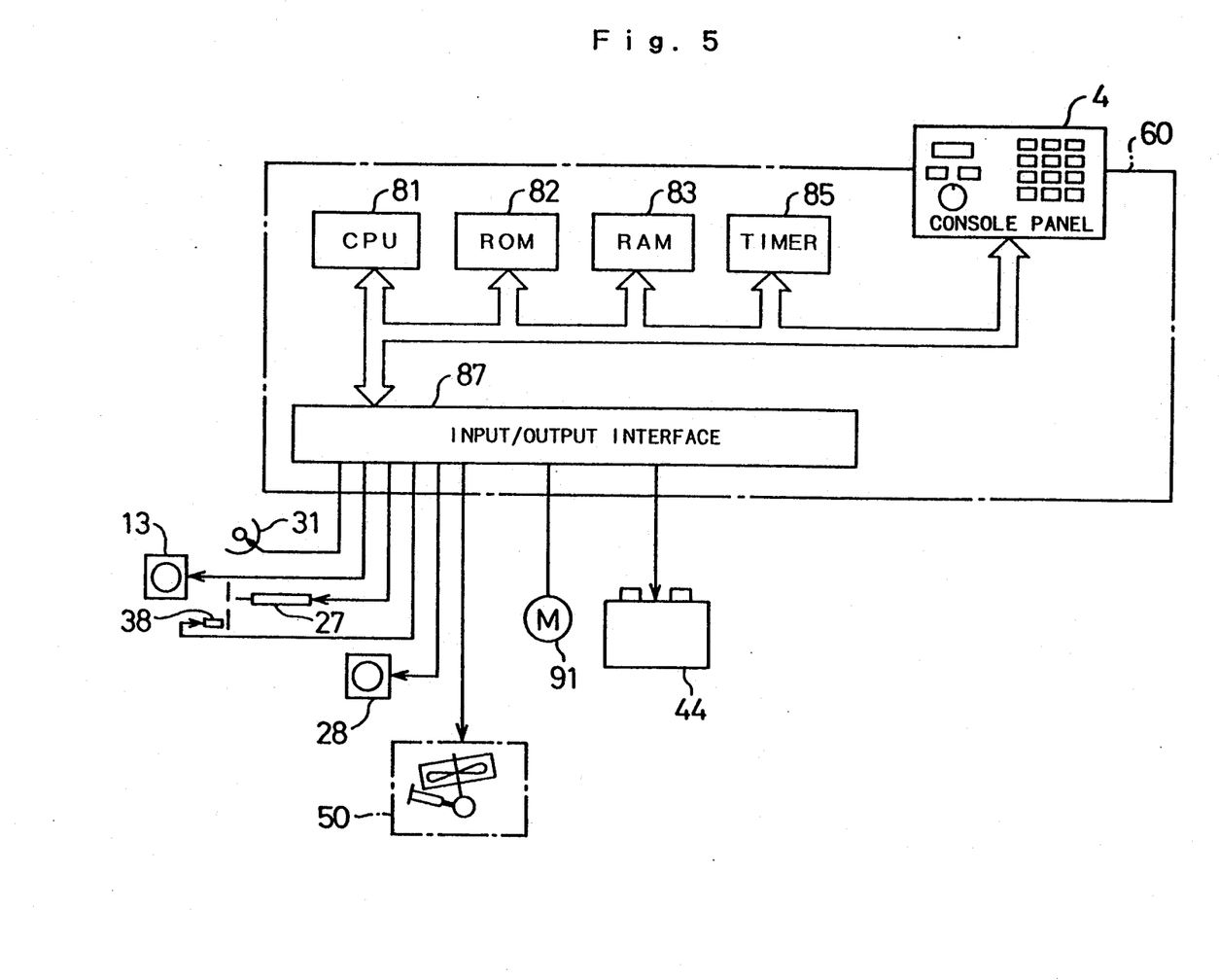
FIG. 5 is a block diagram showing structure of an electronic control unit.

FIG. 5 is a block diagram of the electronic control unit 60. The electronic control unit 60 includes a central processing unit (CPU) 81 for controlling the whole system of the process camera 1, a read only memory (ROM) 82 for storing processing programs, a random access memory (RAM) 83 for temporarily storing data, and a timer 85 for counting the time. The electronic control unit 60 further comprises an input/output interface 87 connected with the external devices or units including the console panel 4, the light source 31, the motor 13 for driving the holder 10, a motor 91 for conveying the photosensitive material PM, the process unit 44 of the processor 40 for development and fixing, and the dry unit 50. The CPU 81 actuates the light source 31 and the motors via the input/output interface 87 according to the processing program stored in the ROM 82.

Figure 6:
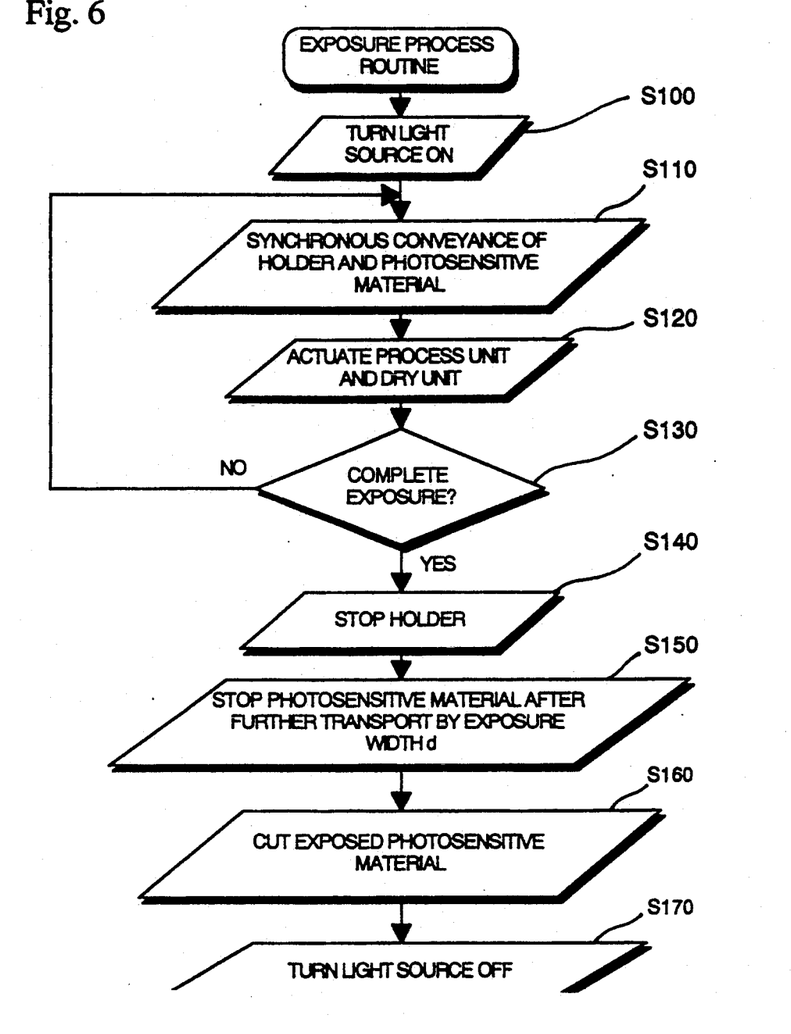
FIG. 6 is a flowchart showing exposure process executed by the electronic control unit.

FIG. 6 is a flowchart of the exposure process executed by the electronic control unit 60. When the exposure starting switch on the console panel 4 is pressed after setting of the length of an original and a reproduction scale, the CPU 81 starts the exposure process routine shown in the flowchart and turns on the light source 31 at step S100. The CPU 81 then starts synchronous conveyance of the holder 10 and the photosensitive material PM at step S110.

The CPU 81 next actuates the process unit 44 and the dry unit 50 at step S120 before the front end of the photosensitive material PM reaches the processor 40. The processor 40 and the dry unit 50 are kept on standby for development and fixing and drying consequently. The synchronous conveyance (step S110) and actuation of the units (step S120) are repeated until completion of exposure is detected at step S130. When the holder 10 moves over the length of the original which is inputted with the console panel 4 and when it is judged that the exposure is completed, the holder 10 is stopped at step S140.

The photosensitive material PM is, on the other hand, stopped not immediately after completion of exposure over the required length of the original, but after further transport by a length equal to an exposure width d at step S150. The exposure width d is a width of the light LB focused on the photosensitive material PM as shown in FIG. 3. Consequently, the photosensitive material PM has an area having the width of d without images thereon at the rear end as well as at the front end.

After ensuring stop of the photosensitive material PM, the CPU 81 actuates the cutting device 27 to cut the photosensitive material PM at step S160. The cutting device 27 drives the cutting blade 75 along the end face 73 of the transport guide 61. The photosensitive material PM is therefore cut at the rim of the light LB. The program then proceeds to step S170 at which the light source 31 is turned off.

The CPU 81 waits at step S180 until development and fixing of the exposed photosensitive material PM are completed by the processor 40 and the dry unit 50. After completion of the development and fixing, the program proceeds to step S190 at which the process unit 44 and the dry unit 50 are stopped in this order. The program then proceeds to 'END' and exits the routine.

According to the slit exposure process camera 1, the photosensitive material PM held with the pair of feeding rollers 25 runs along the feeding face of the transport guide 61 to the exposure position while being pressed with the end of the pressing plate 70. The photosensitive material PM is initially wound on a roll and thus naturally curls along its length; sometimes it shows curvature over its width too. In the above process camera 1, the photosensitive material PM is pressed against the transport guide 61 by the pressing plate 70. The photosensitive material PM is conveyed in contact with the transport guide 61 even after the position of the pressing plate 70 accordingly. This keeps sufficient flatness of the photosensitive material PM in the exposure position immediately after the pressing plate 70. The photosensitive material PM is therefore exposed in a totally flat state.

The above process camera 1 has no pair rollers disposed downstream from the exposure position for holding the photosensitive material PM, but only the single pressing roller 26 there. The single roller 26 does not cause disturbance in the recorded image, which would occur when the front end of the photosensitive material is nipped with a roller pair as described before.

Although the front end portion of the photosensitive material PM, which having a length of d is discarded, it is only several millimeters (in the embodiment, approximately five millimeters) in length and significantly smaller than the useless portion made by the conventional cameras. In short, the process camera in this embodiment efficiently and effectively uses the photosensitive material PM. The smaller useless area on the photosensitive material makes its available area larger.

Figure 7:
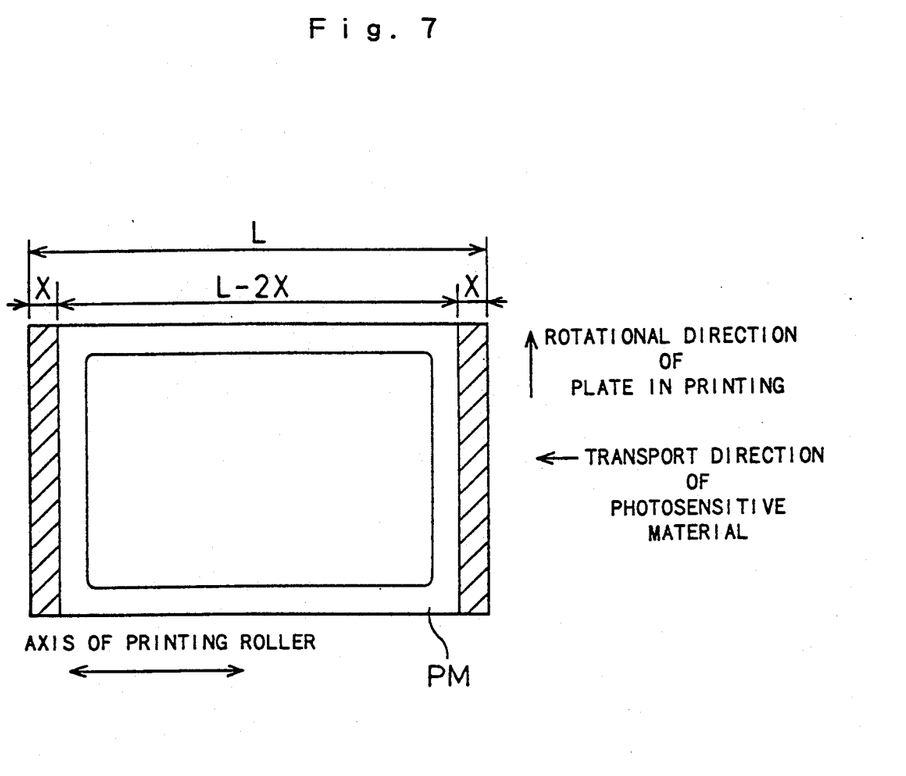
FIG. 7 is an explanatory view illustrating a useful area of a printing plate.

The large available area on the photosensitive material PM has a considerable advantage when the processed photosensitive material PM is used as a plate for small offset printing. FIG. 7 is an explanatory view illustrating an available area of a printing plate for small offset printing. In a rotary press machine, a pair of printing rollers are required to maintain parallel during printing; this further requires the printing plate and the reproduced image on the plate to be positioned at the center along the axis of the pair of printing rollers to thereby make printing papers run through the center of the pair of printing rollers. When rotating direction of the plate in printing is different from the direction of conveyance of the photosensitive material in the process camera as shown in FIG. 7, shaded unusable areas (of width x) are required on both sides of the photosensitive material PM. It means that the available length of the photosensitive material is equal to (L−2X), where L denotes the whole length of the plate. The process camera of the embodiment reduces the width x of the unusable are down to the exposure width d and increases the available area of the photosensitive material PM used as a printing plate.

Furthermore, the structure of the embodiment does not require a pair of downstream rollers for conveying the photosensitive material PM, thus decreasing the number of parts, saving time and labor for assembly, and improving the reliability of the camera. This structure also shortens the feeding path and makes the whole apparatus small.

The pressing plate 70 is made of an opaque material to be used as a slit in close contact with the photosensitive material PM, thus enhancing the resolution of a reproduced image.

In the conventional process cameras, the front end of the photosensitive material is deviated from its path due to curvature or warp of the photosensitive material itself when the photosensitive material is not held by the upstream rollers and the downstream rollers. In the process camera of the embodiment, however, combination of the pair of feeding rollers 25 and the pressing plate 70 securely holds the photosensitive material PM in place.

In the embodiment, the pressing plate 70 is a thin stainless steel plate covered with a polyester tape, but it can be a tape-covered thin plate of another metal with sufficient elasticity, for example, copper or copper alloy such as Cu-Sn-P. Alternatively, the pressing plate 70 can be made of plastics with appropriate elasticity and abrasion resistance, for example, engineering plastics such as polyacetal, polycarbonate and polyimide, and hard rubber. A mirror-like finished metal plate without a tape can be used instead.

There may be man modifications and changes without departing from the scope of the invention. For examples, the process camera can include: plural pressing plates 70 arranged across the photosensitive material; a pressing plate 70 inclined at a smaller or greater angle; a laser for exposing a photosensitive material to record an image thereon while the laser is on-off controlled by a modulater in response to an image singnal representing the recorded image.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A slit exposure apparatus for exposing photosensitive martial with an exposure light beam passing through a transversely extending elongated slit while moving said photosensitive material longitudinally along a path extending across the slit, said apparatus comprising:
   a pair of feeding rollers disposed upstream from an exposure position aligned with said slit, said pair of feeding rollers being constructed to drive said photosensitive material longitudinally downstream from a supply roll of said photosensitive material and through said exposure position while said light beam impinges thereon;
   a guide member with a flat surface for guiding said photosensitive material, said flat surface ranging over a width of said photosensitive material and over a predetermined length upstream from said exposure position;
   a resilient body, including a transversely extending elongated flat portion disposed upstream from said exposure position to be opposed to the flat surface of said guide member, said flat portion being of substantial longitudinally extending width for pressing said photosensitive material against the flat surface of said guide member; and
   a cutter for cutting said photosensitive material over the width thereof in the vicinity of said exposure position.

2. A slit exposure apparatus in accordance with claim 1, wherein:
   said resilient body comprises an abrasion-proof portion to be in contact with said photosensitive material.

3. A slit exposure apparatus in accordance with claim 2, wherein: said abrasion-proof portion comprises a polymeric member to be in contact with said photosensitive material.

4. A slit exposure apparatus in accordance with claim 3, wherein:
   said polymeric member comprises a polyester film.

5. A slit exposure apparatus in accordance with claim 1, wherein:
   said guide member comprises an L-shaped plate having said flat surface and a front end surface along which a cutting blade of said cutter travels.

6. A slit exposure apparatus in accordance with claim 5, wherein:
   said front end surface is positioned at a downstream edge of said exposure light beam.

7. A slit exposure apparatus in accordance with claim 1, further comprising:
   a non-nipping roller, disposed downstream from and in the vicinity of said exposure position, for preventing rise of the photosensitive material.

8. A slit exposure apparatus in accordance with claim 1, wherein:
   said flat portion of resilient body comprises an opaque member functioning as an edge of the slit.

9. A slit exposure apparatus in accordance with claim 8, further comprising:
   a slit plate, disposed opposite to said opaque member across said exposure light beam, for functioning as another edge of said slit.

10. A slit exposure apparatus in accordance with claim 1, further comprising:
    first transport means for relatively conveying an original and a light source to thereby scan the original with a light beam; and
    second transport means for conveying said photosensitive material in synchronism with scanning of the original.

11. A slit exposure apparatus in accordance with claim 1, further comprising:
    a developing unit for developing said photosensitive material after exposure; and
    a fixing unit for fixing said photosensitive material after said developing, to thereby make said photosensitive material a printing plate.

12. A slit exposure apparatus in accordance with claim 1, further comprising:
    cutting control means for cutting said photosensitive material with said cutter after conveying said photosensitive material by an additional distance on completion of exposure of said photosensitive material, said additional distance being equal to a width of said exposure light beam.

13. A slit exposure apparatus in accordance with claim 1 in which the cutter is disposed immediately downstream of said slit.

14. A slit exposure apparatus for exposing photosensitive material with an exposure light beam passing through a transversely extending elongated slit while moving said photosensitive material longitudinally along a path extending across the slit, said apparatus comprising:
    a feed roller means disposed upstream from an exposure position aligned with said slit, said roller means being constructed to drive said photosensitive material longitudinally downstream from a supply roll of said photosensitive material and through said exposure position while said light beam impinges thereon;
    a guide member with a flat surface for guiding said photosensitive material, said flat surface ranging over a width of said photosensitive material and over a predetermined length upstream from said exposure position;
    a resilient body from pressing said photosensitive material against the flat surface of said guide member, said body being disposed upstream from said exposure position and downstream of said roller means;
    a cutter for cutting said photosensitive material over the width thereof in the vicinity of said exposure position; and
    a non-nipping roller, disposed downstream from and in the vicinity of said exposure position, for preventing the photosensitive material form rising.

15. A slit exposure apparatus in accordance with claim 14, in which said non-nipping roller is a first instrumentality disposed along said path downstream of said cutter and said exposure position in operative position for engagement by said photosensitive material.

16. A slit exposure apparatus in accordance with claim 15 in which the cutter is disposed immediately downstream of said slit.

* * * * *